(12) United States Patent
Min et al.

(10) Patent No.: US 11,133,262 B2
(45) Date of Patent: Sep. 28, 2021

(54) SEMICONDUCTOR PACKAGES AND DISPLAY DEVICES INCLUDING THE SAME

(71) Applicant: Samsung Electronics Co., Ltd., Suwon-si (KR)

(72) Inventors: Ji Ah Min, Yeongdong-gun (KR); Ye Chung Chung, Hwaseong-si (KR)

(73) Assignee: Samsung Electronics Co., Ltd.

( * ) Notice: Subject to any disclaimer, the term of this patent is extended or adjusted under 35 U.S.C. 154(b) by 27 days.

(21) Appl. No.: 16/811,389

(22) Filed: Mar. 6, 2020

(65) Prior Publication Data

US 2020/0211972 A1 Jul. 2, 2020

Related U.S. Application Data

(63) Continuation of application No. 16/170,804, filed on Oct. 25, 2018, now Pat. No. 10,607,939.

(30) Foreign Application Priority Data

Feb. 7, 2018 (KR) .................. 10-2018-0014978

(51) Int. Cl.
*H01L 23/52* (2006.01)
*H01L 23/538* (2006.01)
*H01L 23/498* (2006.01)
*H01L 25/065* (2006.01)
*H01L 27/12* (2006.01)

(52) U.S. Cl.
CPC ........ *H01L 23/5386* (2013.01); *H01L 23/498* (2013.01); *H01L 23/49811* (2013.01); *H01L 23/5384* (2013.01); *H01L 25/0655* (2013.01); *H01L 27/124* (2013.01)

(58) Field of Classification Search
CPC ............. H01L 23/5386; H01L 23/5384; H01L 23/498; H01L 23/49811; H01L 25/0655; H01L 27/124
USPC ........................................................ 257/774
See application file for complete search history.

(56) References Cited

U.S. PATENT DOCUMENTS

| | | | |
|---|---|---|---|
| 5,822,191 A * | 10/1998 | Tagusa | H01L 24/86 361/751 |
| 6,677,664 B2 | 1/2004 | Inoue et al. | |
| 7,902,645 B2 * | 3/2011 | Nakayama | G09G 3/20 257/666 |
| 8,174,839 B2 * | 5/2012 | Kim | H05K 1/147 361/760 |

(Continued)

FOREIGN PATENT DOCUMENTS

| | | |
|---|---|---|
| JP | H09134928 | 5/1997 |
| JP | 3837220 | 10/2006 |
| KR | 10-2016-0093183 | 8/2016 |

*Primary Examiner* — Luan C Thai
(74) *Attorney, Agent, or Firm* — Myers Bigel, P.A

(57) ABSTRACT

Semiconductor packages are provided. A semiconductor package includes a substrate including a first bonding region, a chip region, and a second bonding region. Moreover, the substrate includes first and second surfaces that are opposite to each other. The semiconductor package includes a pad group including a pad on the first surface in the chip region. The semiconductor package includes a semiconductor chip on the pad group. The semiconductor package includes a wire connecting the pad and the second bonding region. The wire includes a portion that extends along the second surface of the substrate. Related display devices are also provided.

16 Claims, 16 Drawing Sheets

(56) References Cited

U.S. PATENT DOCUMENTS

| | | |
|---|---|---|
| 8,350,158 B2 | 1/2013 | Chung et al. |
| 8,576,576 B2 | 11/2013 | Kim |
| 9,349,683 B2 | 5/2016 | Jung et al. |
| 9,768,106 B2 | 9/2017 | Cho et al. |
| 2003/0209803 A1 | 11/2003 | Suzuki et al. |
| 2016/0351155 A1 | 12/2016 | Park et al. |

\* cited by examiner

SEMICONDUCTOR PACKAGES AND DISPLAY DEVICES INCLUDING THE SAME

This application is a continuation of and claims priority from U.S. patent application Ser. No. 16/170,804, filed on Oct. 25, 2018, which claims priority to Korean Patent Application No. 10-2018-0014978, filed on Feb. 7, 2018, and all the benefits accruing therefrom under 35 U.S.C. § 119, the disclosures of which are hereby incorporated herein by reference in entirety.

BACKGROUND

The present disclosure relates to semiconductor packages and display devices including the same. As electronic products have increasingly become compact in size, thin, and lightweight, tape film packages have been suggested as high-integration density semiconductor chip attachment technology. Examples of the tape film packages include a tape carrier package and a chip-on film (COF) package.

In the COF package, a semiconductor chip may be bonded directly on a substrate by flip-chip bonding and may be connected to an external circuit via wires. Since fine wire patterns can be formed in the COF package, the COF package has drawn attention as a high-integration density package.

SUMMARY

Example embodiments of the present disclosure provide a compact semiconductor package, such as a COF semiconductor package and a display device including the COF semiconductor package. Accordingly, example embodiments of the present disclosure may provide a compact display device.

However, the inventive concepts of the present disclosure are not limited to the example embodiments set forth herein. The above and other example embodiments of the present disclosure will become more apparent to one of ordinary skill in the art to which the present disclosure pertains by referencing the detailed description of the present disclosure given below.

According to some example embodiments of the present disclosure, there is provided a semiconductor package a film substrate including a first bonding region, a chip region, and a second bonding region that are in a sequence in a first direction. The film substrate may further include first and second surfaces that are opposite to each other. The semiconductor package may include a pad group that may include first, second, and third pads on the first surface in the chip region and spaced apart from each other in a second direction that intersects the first direction. The semiconductor package may include a first semiconductor chip on the pad group on the first surface. The semiconductor package may include a second semiconductor chip on the first surface in the chip region, and in a sequence in the second direction together with the first semiconductor chip, adjacent the first pad. The semiconductor package may include a first wire connecting the first pad and the second bonding region. The semiconductor package may include a second wire connecting the second pad and the first bonding region. The semiconductor package may include a third wire connecting the third pad and the second bonding region. The first wire may include a first via that penetrates the film substrate, a first extended portion that connects the first pad and the first via, and a second extended portion that connects the first via and the second bonding region and extends along the second surface of the film substrate.

According to some example embodiments of the present disclosure, there is provided a semiconductor package including a film substrate including a first bonding region, a chip region, and a second bonding region that are in a sequence in a first direction. The film substrate may further include first and second surfaces that are opposite to each other. The semiconductor package may include a first pad group including first and second pads that are on the first surface in the chip region and are spaced apart from each other in a second direction that intersects the first direction. The semiconductor package may include a second pad group including a third pad that is on the first surface in the chip region and is spaced apart in the second direction from the second pad with the first pad therebetween. The semiconductor package may include a first semiconductor chip on the first pad group. The semiconductor package may include a second semiconductor chip on the second pad group and adjacent the first semiconductor chip in the second direction. The semiconductor package may include a first wire including a first via that penetrates the film substrate, a first extended portion that connects the first pad and the first via, and a second extended portion that connects the first via and the second bonding region and extends along the second surface of the film substrate. The semiconductor package may include a second wire connecting the second pad and the first bonding region. The semiconductor package may include a third wire including a second via that penetrates the film substrate, a third extended portion that connects the third pad and the second via, and a fourth extended portion that connects the second via and the second bonding region and extends along the second surface of the film substrate.

According to some example embodiments of the present disclosure, there is provided a semiconductor package including a substrate including a first bonding region, a second bonding region, and a chip region that is between the first and second bonding regions in a first direction. The substrate may further include first and second surfaces that are opposite to each other. The semiconductor package may include a pad group including first and second pads that are on the first surface in the chip region and are spaced apart from each other in a second direction that intersects the first direction. The pad group may be adjacent the first bonding region. The semiconductor package may include a first semiconductor chip on the pad group on the first surface. The semiconductor package may include a second semiconductor chip on the first surface in the chip region, adjacent the first semiconductor chip in the second direction, and closer to the first pad than to the second pad. The semiconductor package may include a first wire connecting the first pad and the second bonding region. The semiconductor package may include a second wire connecting the second pad and the second bonding region and extending along the first surface of the substrate. The first wire may include a first via that penetrates the substrate, a first extended portion that connects the first pad and the first via, and a second extended portion that connects the first via and the second bonding region and extends along the second surface of the substrate.

According to some example embodiments of the present disclosure, there is provided a display device including a film substrate including a first bonding region, a chip region, and a second bonding region that are in a sequence in a first direction. The film substrate may further include first and second surfaces that are opposite to each other. The display device may include a pad group including input and output pads that are on the first surface in the chip region and are spaced apart from each other in a second direction that intersects the first direction. The display device may include a first display driver integrated circuit (DDI) on the pad group on the first surface. The display device may include a second DDI on the first surface in the chip region, adjacent the first DDI in the second direction, and closer to the output pad than to the input pad. The display device may include an input wire connecting the input pad and the first bonding region and extending along the first surface of the film substrate. Moreover, the display device may include an output wire connecting the output pad and the second bonding region and extending at least partially along the second surface of the film substrate.

Other features and example embodiments may be apparent from the following detailed description, the drawings, and the claims.

BRIEF DESCRIPTION OF THE DRAWINGS

The above and other example embodiments and features of the present disclosure will become more apparent by describing in detail example embodiments thereof with reference to the attached drawings, in which.

DETAILED DESCRIPTION

Semiconductor packages according to some example embodiments of the present disclosure will hereinafter be described with reference to FIGS. 1 through 13.

Figure 1:
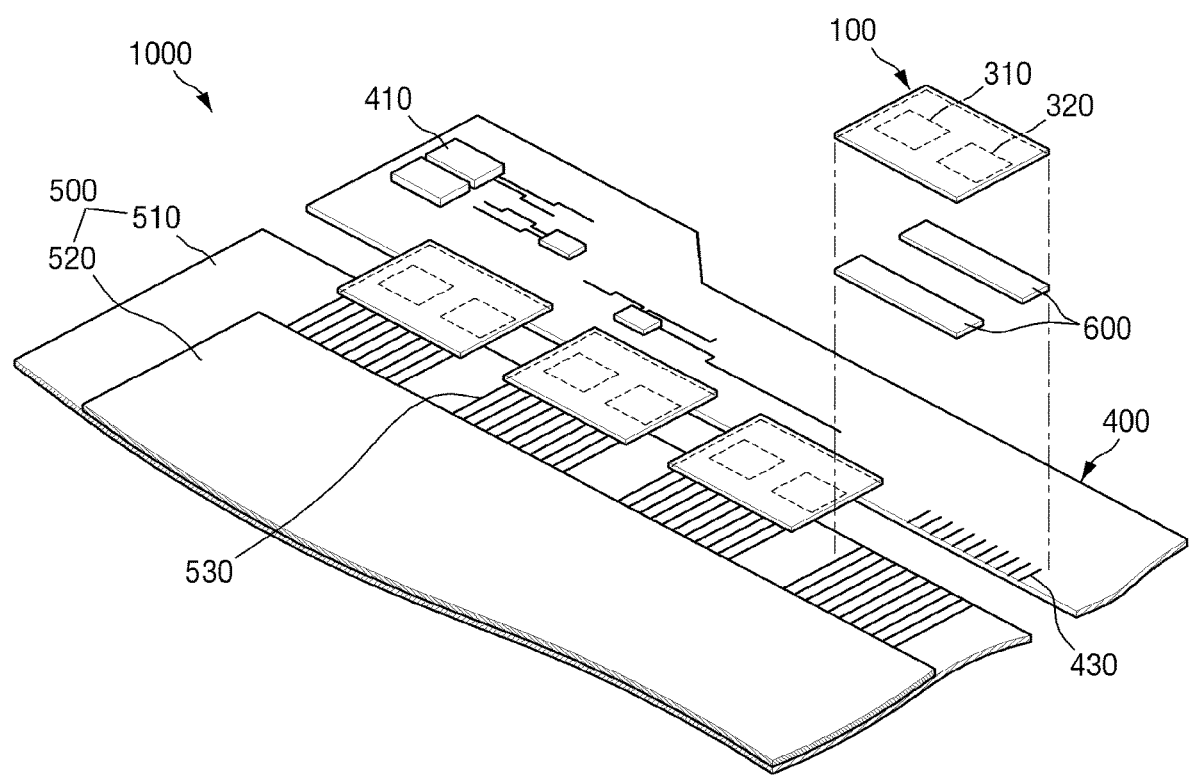
FIG. 1 is a perspective view of a display device, including a semiconductor package, according to some example embodiments of the present disclosure.

FIG. 1 is a perspective view of a display device, including a semiconductor package, according to some example embodiments of the present disclosure.

Referring to FIG. 1, a display device 1000 may include semiconductor packages 100, a driver printed circuit 400, and a display panel 500.

The semiconductor packages 100 may be connected to the driver printed circuit 400 and the display panel 500 between the driver printed circuit 400 and the display panel 500. The semiconductor packages 100 may receive signals from the driver printed circuit 400 and may output the received signals to the display panel 500.

The semiconductor packages 100 may be chip-on-film (COF) semiconductor packages. For example, the semiconductor packages 100 may be semiconductor packages having semiconductor chips attached thereon. In some example embodiments, each of the semiconductor packages 100 may include two or more semiconductor chips. For example, each of the semiconductor packages 100 may include first and second semiconductor chips 310 and 320.

The semiconductor packages 100 may be, for example, display driver integrated circuit (DDI) packages. For example, the first and second semiconductor chips 310 and 320 may be DDIs. For example, the first and second semiconductor chips 310 and 320 may realize colors by controlling pixels of the display panel 500.

The driver printed circuit 400 may be connected to first sides of the semiconductor packages 100. For example, the driver printed circuit 400 may include driver connecting wires 430, which are formed on the surface of the driver printed circuit 400. The driver connecting wires 430 may be connected to the semiconductor packages 100 and may electrically connect the first semiconductor chip 310 and/or the second semiconductor chip 320 of each of the semiconductor packages 100 to the driver printed circuit 400.

The driver printed circuit 400 may include one or more driver integrated circuit (IC) chips 410. The driver IC chips 410 may apply power and signals at the same time to the semiconductor packages 100. The driver printed circuit 400 may include, for example, a printed circuit board (PCB).

The display panel 500 may be connected to second sides of the semiconductor packages 100. For example, the display panel 500 may include panel connecting wires 530, which are formed on the surface of the display panel 500. The panel connecting wires 530 may be connected to the semiconductor packages 100 and may electrically connect the first semiconductor chip 310 and/or the second semiconductor chip 320 of each of the semiconductor packages 100 to the display panel 500.

The display panel 500 may include a display substrate 510 and an image region 520, which is formed on the display substrate 510. The display substrate 510 may be, for example, a glass substrate or a flexible substrate. In the image region 520, a plurality of pixels may be formed. The pixels of the image region 520 may operate in accordance with signals provided by the semiconductor packages 100.

The semiconductor packages 100 may be electrically connected to the display panel 500 and may perform the functions of a gate driver or a source driver. For example, the semiconductor packages 100 may be connected to gate lines of the display panel 500 and may perform the functions of a gate driver. Alternatively, the semiconductor packages 100 may be connected to source lines of the display panel 500 and may perform the functions of a source driver.

The display panel 500 may include, for example, at least one of a liquid crystal display (LCD) panel, a light-emitting diode (LED) panel, an organic LED (OLED) panel, or a plasma display panel (PDP).

In some example embodiments, a plurality of semiconductor packages 100 may be connected between the driver printed circuit 400 and the display panel 500. For example, in a case where the display panel 500 is for providing a large-size screen such as that of a television (TV) or for supporting high resolution, the display device 1000 may include a plurality of semiconductor packages 100.

In some example embodiments, a single semiconductor package 100 may be connected between the driver printed circuit 400 and the display panel 500. For example, in a case where the display panel 500 is for providing a small-size screen such as that of a mobile phone or for supporting low resolution, the display device 1000 may include only one semiconductor package 100.

In some example embodiments, the semiconductor packages 100 may be connected to the driver connecting wires 430 of the driver printed circuit 400 and the panel connecting wires 530 of the display panel 500 by anisotropic conductive layers 600.

The anisotropic conductive layers 600 may be, for example, anisotropic conductive films or anisotropic conductive pastes. Each of the anisotropic conductive layers 600 may have a structure in which conductive particles are dispersed in an insulating adhesive layer. The anisotropic conductive layers 600 may have an anisotropic electrical characteristic. In other words, the anisotropic conductive layers 600 may be electrically conductive only in, for example, a vertical direction, and may be insulative in, for example, a horizontal direction.

Figure 2:
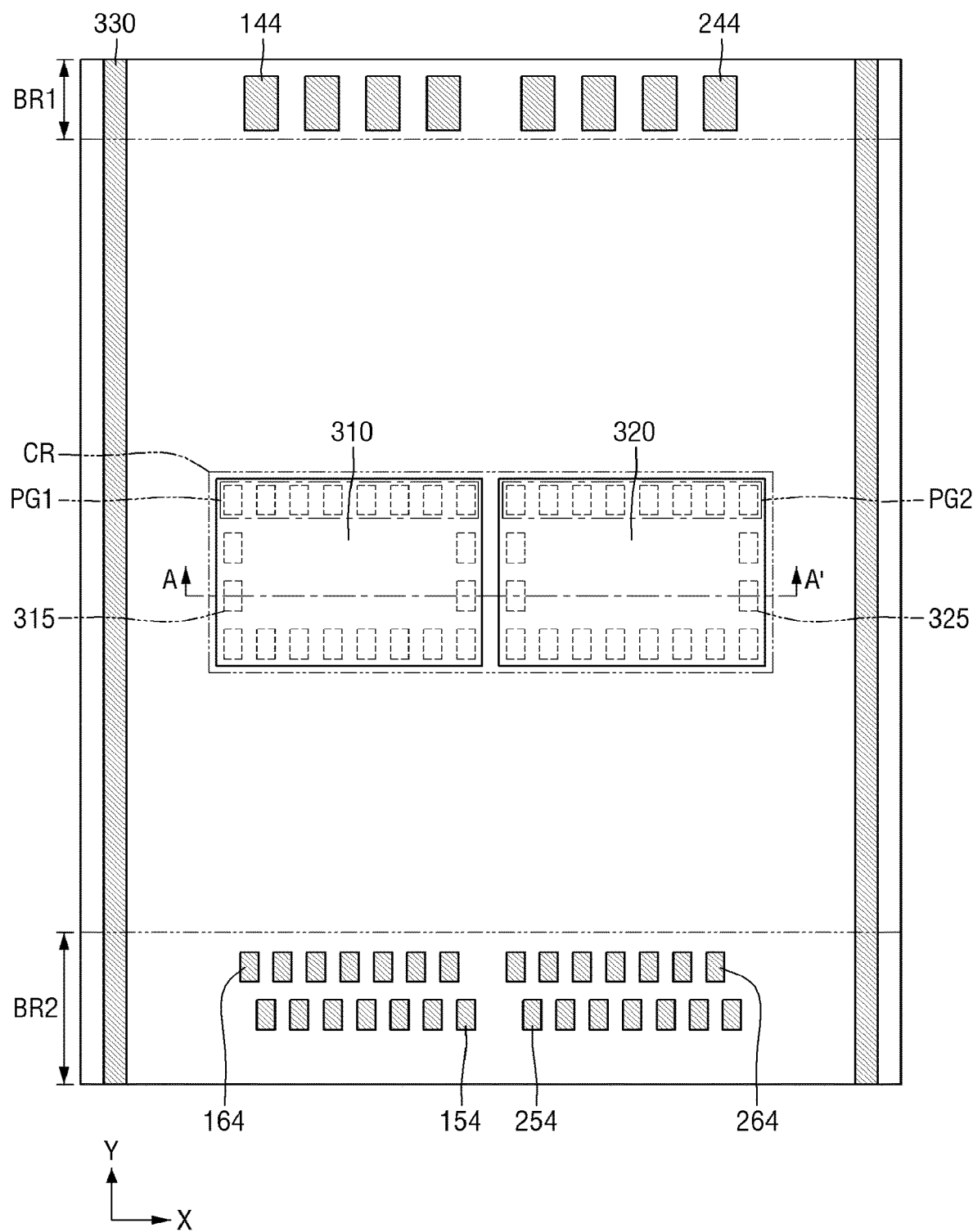
FIG. 2 is a layout view of a semiconductor package according to some example embodiments of the present disclosure.
Figure 3:
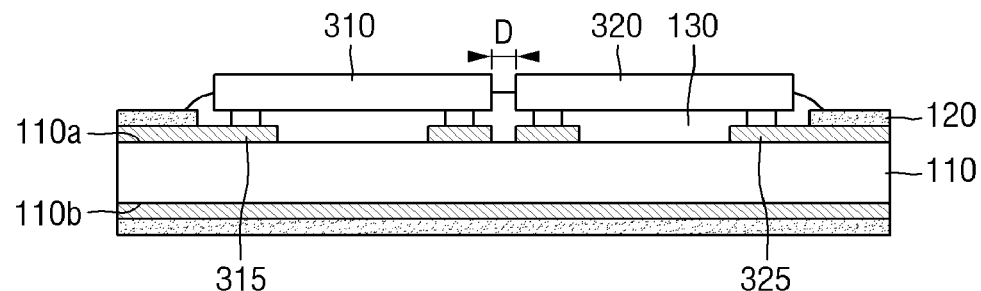
FIGS. 3 and 4 are cross-sectional views taken along line A-A' of FIG. 2.
Figure 4:
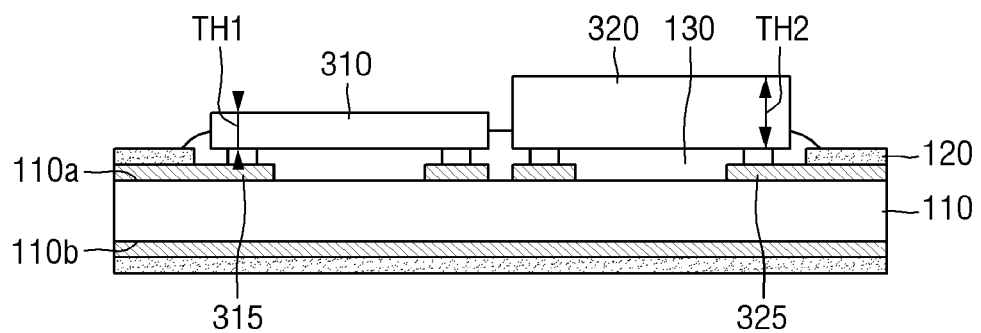

FIG. 2 is a layout view of a semiconductor package according to some example embodiments of the present disclosure. FIGS. 3 and 4 are cross-sectional views taken along line A-A' of FIG. 2. For convenience, descriptions of elements or features that have already been described above with reference to FIG. 1 may be omitted or at least simplified. Also, for convenience, some wires extending along a substrate, such as a film substrate 110, are not illustrated.

The semiconductor package according to some example embodiments of the present disclosure will hereinafter be described taking the semiconductor packages 100 of FIG. 1 as an example, but the present disclosure is not limited thereto. For example, the semiconductor package according to some example embodiments of the present disclosure may be a system-on-film (SOF) semiconductor package.

Referring to FIGS. 2 through 4, the semiconductor package according to some example embodiments of the present disclosure includes the film substrate 110, a plurality of first chip pads 315, a plurality of second chip pads 325, a first bonding pad 144, a second bonding pad 244, a third bonding pad 154, a fourth bonding pad 164, a fifth bonding pad 254, a sixth bonding pad 264, a first semiconductor chip 310, a second semiconductor chip 320, direct wires 330, a resist film 120, and a mold film 130.

The film substrate 110 may include a first bonding region BR1, a chip region CR, and a second bonding region BR2. The first bonding region BR1, the chip region CR, and the second bonding region BR2 may be in a sequence (e.g., sequentially arranged) in a first direction Y.

For example, the first and second bonding regions BR1 and BR2 may be disposed at both sides of the film substrate 110, and the chip region CR may be disposed between the first and second bonding regions BR1 and BR2. For example, the chip region CR may be formed in a middle part of the film substrate 110.

The first bonding region BR1 may be, for example, a region of the film substrate 110 to which the driver printed circuit 400 of FIG. 1 is connected. The second bonding region BR2 may be, for example, a region of the film substrate 110 to which the display panel 500 of FIG. 1 is connected. The chip region CR may be, for example, a region of the film substrate 110 where the first and second semiconductor chips 310 and 320 are attached. In the chip region CR, the first and second semiconductor chips 310 and 320 may be arranged adjacent to each other in a second direction X, which intersects (e.g., is perpendicular to) the first direction Y.

The film substrate 110 may include first and second surfaces 110a and 110b, which are opposite to each other. For example, the first surface 110a may be the top surface of the film substrate 110, and the second surface 110b may be the bottom surface of the film substrate 110.

The film substrate 110 may be, for example, a flexible film. For example, the film substrate 110 may be a flexible film comprising polyimide or an epoxy resin.

The first chip pads 315 may be formed on the first surface 110a of the chip region. The first chip pads 315 may be electrically connected to the first semiconductor chip 310. For example, the first semiconductor chip 310 may be disposed on the first chip pads 315. The first chip pads 315 are illustrated in FIG. 2 as being arranged in a row along the edges of the first semiconductor chip 310, but the present disclosure is not limited thereto. Alternatively, the first chip pads 315 may be arranged along only some of the edges of the first semiconductor chip 310. Still alternatively, the first chip pads 315 may be arranged in two or more rows along the edges of the first semiconductor chip 310.

Some of the first chip pads 315 may be input pads, and some of the first chip pads 315 may be output pads. This will be described later in detail with reference to FIGS. 7 through 13.

In some example embodiments, some of the first chip pads 315 may be dummy pads. For example, some of the first chip pads 315 may not be electrically connected to bonding pads, and these dummy pads may be formed in the middle part of the chip region CR, but the present disclosure is not limited thereto.

The first chip pads 315 may include a first pad group PG1. The first pad group PG1 may include first chip pads 315 that are arranged in the second direction X. The first pad group PG1 may include first chip pads 315 that are adjacent to the first bonding region BR1.

The second chip pads 325 may be formed on the first surface 110a of the chip region CR. The second chip pads 325 may be electrically connected to the second semiconductor chip 320. For example, the second semiconductor chip 320 may be disposed on the second chip pads 325. The second chip pads 325, like the first chip pads 315, are illustrated in FIG. 2 as being arranged in a row along the edges of the second semiconductor chip 320, but the present disclosure is not limited thereto.

Some of the second chip pads 325 may be input pads, and some of the second chip pads 325 may be output pads. This will be described later in detail with reference to FIGS. 7 through 13.

In some example embodiments, some of the second chip pads 325 may be dummy pads. For example, some of the second chip pads 325 may not be electrically connected to bonding pads, and these dummy pads may be formed in the middle part of the chip region CR, but the present disclosure is not limited thereto.

The second chip pads 325 may include a second pad group PG2. The second pad group PG2 may include second chip pads 325 that are arranged in the second direction X. The second pad group PG2 may include second chip pads 325 that are adjacent to the first bonding region BR1. For example, the second pad group PG2 may be disposed adjacent to the first pad group PG1 in the second direction X.

The first and second bonding pads 144 and 244 may be formed in the first bonding region BR1. In some example embodiments, the first and second bonding pads 144 and 244 may be formed on the first surface 110a of the first bonding region BR1. The first and second bonding pads 144 and 244 may be electrically connected to, for example, the driver connecting wires 430 of the driver printed circuit 400 of FIG. 1.

The first and second bonding pads 144 and 244 may be formed in the first bonding region BR1. For example, the first and second bonding pads 144 and 244 may be arranged in parallel in the second direction X.

The third, fourth, fifth, and sixth bonding pads 154, 164, 254, and 264 may be formed in the second bonding region BR2. In some example embodiments, the third, fourth, fifth, and sixth bonding pads 154, 164, 254, and 264 may be formed on the first surface 110a of the second bonding region BR2. The third, fourth, fifth, and sixth bonding pads 154, 164, 254, and 264 may be electrically connected to, for example, the panel connecting wires 530 of the display panel 500 of FIG. 1.

A plurality of third bonding pads 154 and a plurality of fifth bonding pads 254 may be formed in the second bonding region BR2. For example, the plurality of third bonding pads 154 and the plurality of fifth bonding pads 254 may be formed in parallel in the second direction X.

Similarly, a plurality of fourth bonding pads 164 and a plurality of sixth bonding pads 264 may be formed in the second bonding region BR2. For example, the plurality of fourth bonding pads 164 and the plurality of sixth bonding pads 264 may be arranged in parallel in the second direction X.

In some example embodiments, the fourth and sixth bonding pads 164 and 264 may be closer than the third and fifth bonding pads 154 and 254 to the chip region CR. For example, the fourth bonding pad 164 may be disposed between the third bonding pad 154 and the chip region CR, and the sixth bonding pad 264 may be disposed between the fifth bonding pad 254 and the chip region CR.

In some example embodiments, the sum of the number of third bonding pads 154 and the number of fourth bonding pads 164 may be greater than the number of first bonding pads 144, and the sum of the number of fifth bonding pads 254 and the number of sixth bonding pads 264 may be greater than the number of second bonding pads 244.

Figure 7:
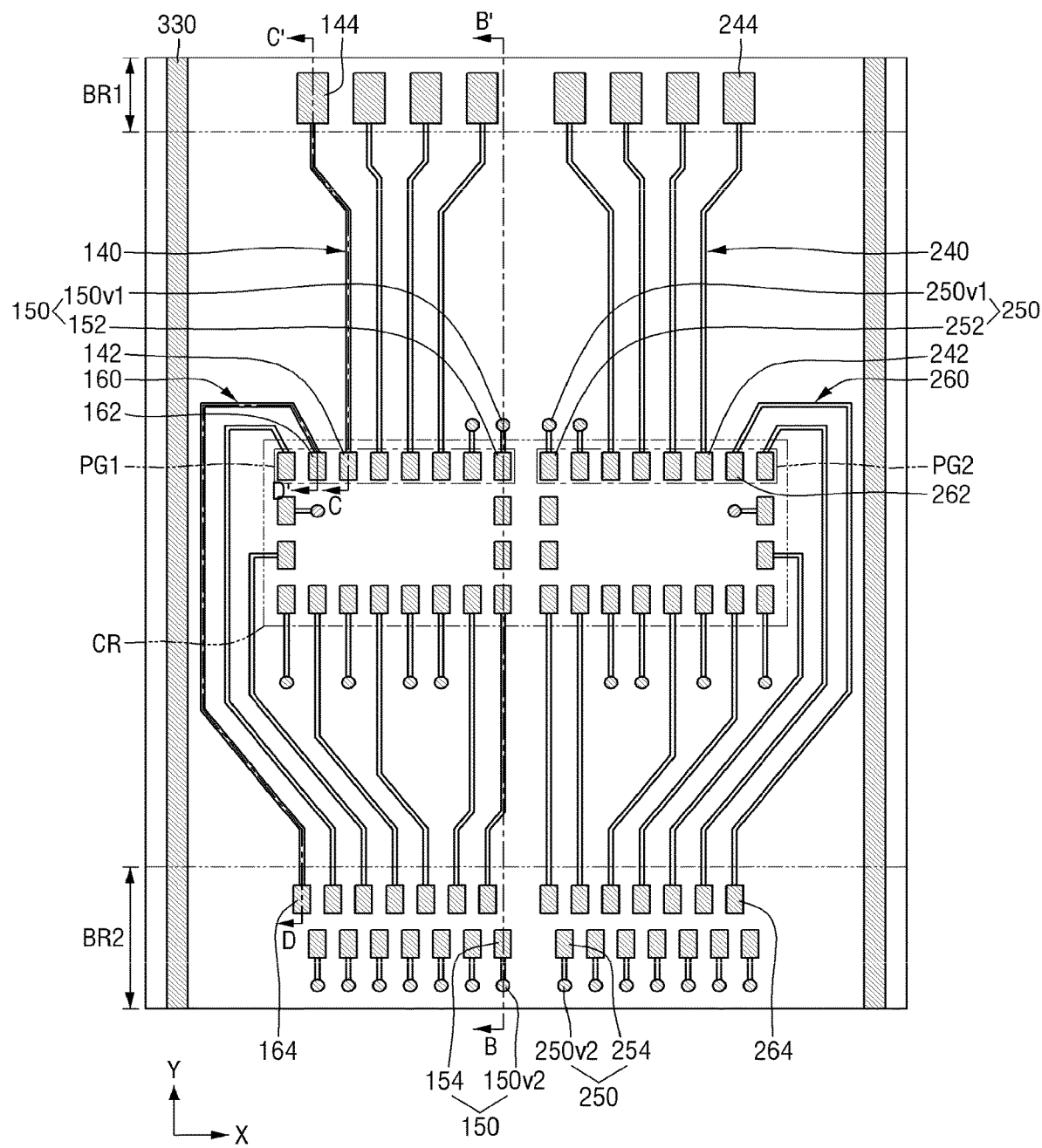
FIGS. 7 and 8 are layout views of a semiconductor package according to some example embodiments of the present disclosure.
Figure 8:
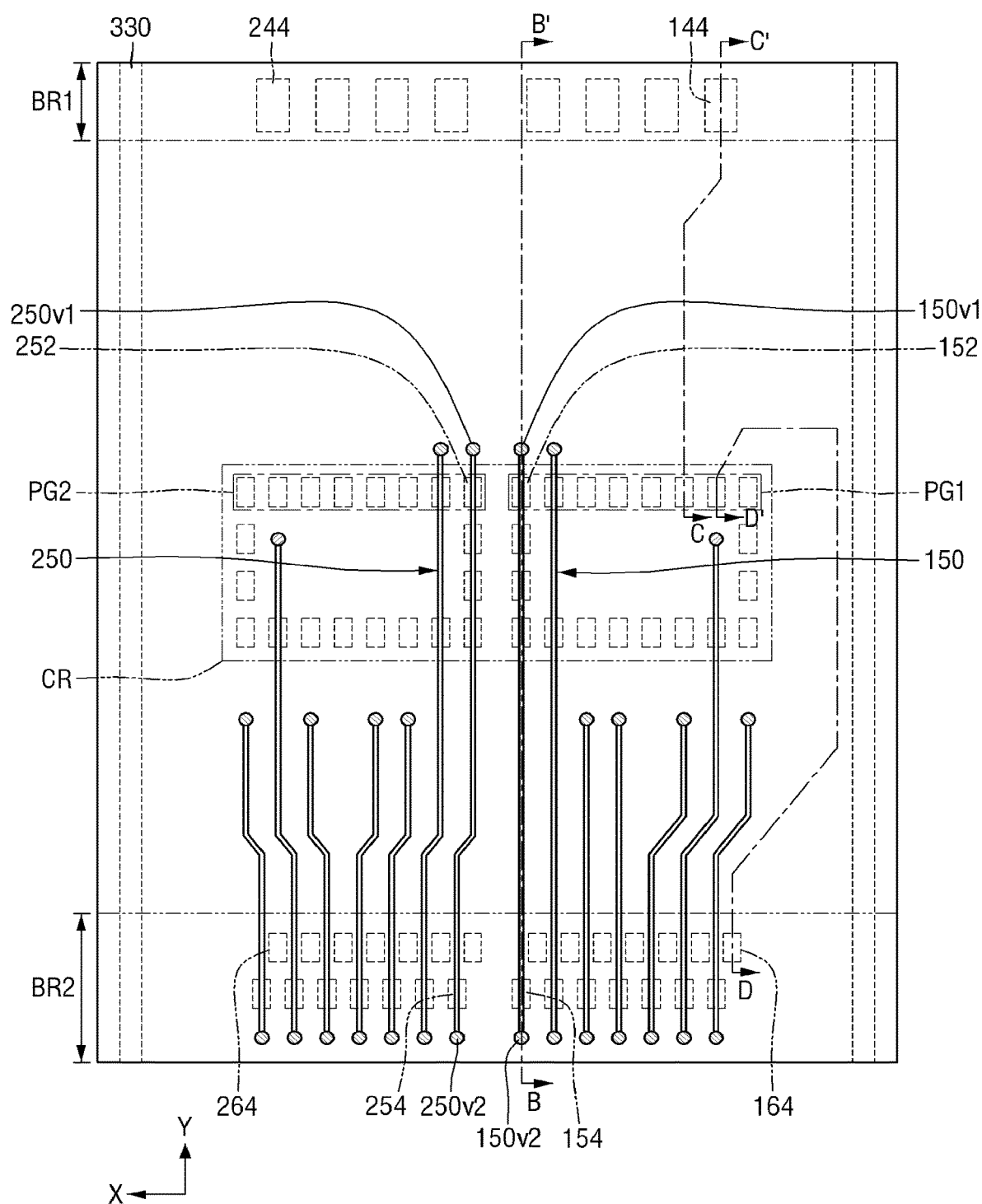

The number of third bonding pads 154 and the number of fourth bonding pads 164 are illustrated in FIGS. 7 and 8 as being the same, and the number of fifth bonding pads 254 and the number of sixth bonding pads 264 are illustrated in FIGS. 7 and 8 as being the same. However, the present disclosure is not limited to the example of FIGS. 7 and 8. That is, alternatively, the number of third bonding pads 154 may be smaller than the number of fourth bonding pads 164, or vice versa.

The third and fourth bonding pads 154 and 164 may be spaced apart from each other, and the fifth and sixth bonding pads 254 and 264 may be spaced apart from each other. The third and fourth bonding pads 154 and 164 may be staggered from each other, and the fifth and sixth bonding pads 254 and 264 may be staggered from each other. However, the present disclosure is not limited to this. That is, alternatively, the third and fourth bonding pads 154 and 164 may be arranged in line in the first direction Y, and the fifth and sixth bonding pads 254 and 264 may be arranged in line in the first direction Y.

The direct wires 330 may connect the first and second bonding regions BR1 and BR2. For example, the direct wires 330 may extend in the first direction Y to connect the first and second bonding regions BR1 and BR2. In some example embodiments, the direct wires 330 may extend along the first surface 110a of the film substrate 110.

Parts of the direct wires 330 in the first bonding region BR1 may be electrically connected to, for example, the driver connecting wires 430 of the driver printed circuit 400 of FIG. 1. Parts of the direct wires 330 in the second bonding region BR2 may be electrically connected to, for example, the panel connecting wires 530 of the display panel 500 of FIG. 1. Accordingly, the direct wires 330 may electrically connect the driver printed circuit 400 and the display panel 500.

The semiconductor package according to some example embodiments of the present disclosure may not include (i.e., may omit) the direct wires 330. For example, in some example embodiments, the direct wires 330, which connect the first and second bonding regions BR1 and BR2, may not be provided.

The resist film 120 may be on (e.g., may cover) the wires on the film substrate 110. Also, the resist film 120 may expose some of the wires on the film substrate 110. For example, as illustrated in FIGS. 3 and 4, the resist film 120 may expose the first chip pads 315 and the second chip pads 325.

Accordingly, the first chip pads 315 may be connected to the first semiconductor chip 310, and the second chip pads 325 may be connected to the second semiconductor chip 320. The first chip pads 315 may be electrically connected to the first semiconductor chip 310 via conductive bumps, and the second chip pads 325 may be electrically connected to the second semiconductor chip 320 via conductive bumps. However, the present disclosure is not limited to this.

The mold film 130 may be formed between the film substrate 110 and the first and second semiconductor chips 310 and 320. The mold film 130 may be on (e.g., may cover) the first chip pads 315 and the second chip pads 325.

The mold film 130 may comprise, for example, an epoxy resin. The mold film 130 may be formed by, for example, a capillary under-fill method, but the present disclosure is not limited thereto.

As already mentioned above, the first and second semiconductor chips 310 and 320 may be adjacent to each other. In some example embodiments, a distance D between the first and second semiconductor chips 310 and 320 may be 100 micrometers ($\mu$m) or less (i.e., or shorter). In some example embodiments, the first and second semiconductor chips 310 and 320 may be placed in contact with each other.

In some example embodiments, the first and second semiconductor chips 310 and 320 may have a height difference. For example, as illustrated in FIG. 4, a first thickness TH1 of the first semiconductor chip 310 and a second thickness TH2 of the second semiconductor chip 320 may differ from each other. The first thickness TH1 is illustrated in FIG. 4 as being smaller than the second thickness TH2, but the present disclosure is not limited thereto. That is, alternatively, the first thickness TH1 may be greater than the second thickness TH2.

Figure 5:
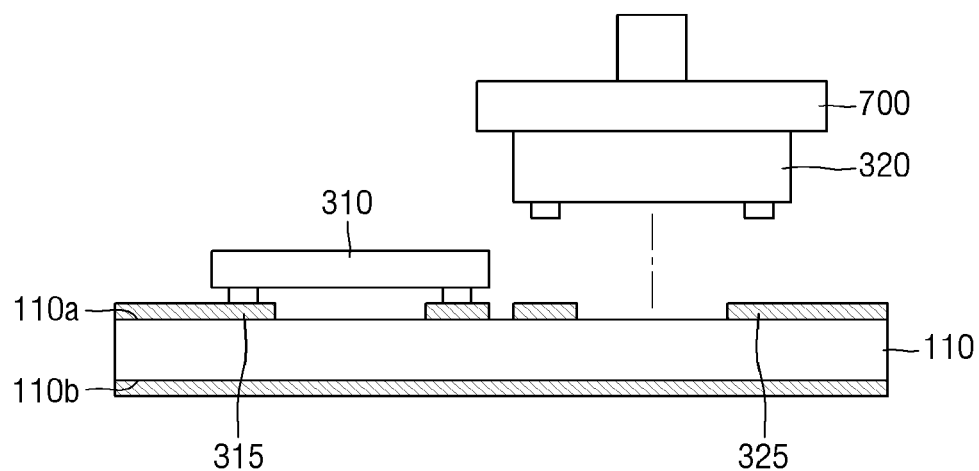
FIGS. 5 and 6 are cross-sectional views illustrating methods of attaching semiconductor chips on a semiconductor package according to some example embodiments of the present disclosure.
Figure 6:
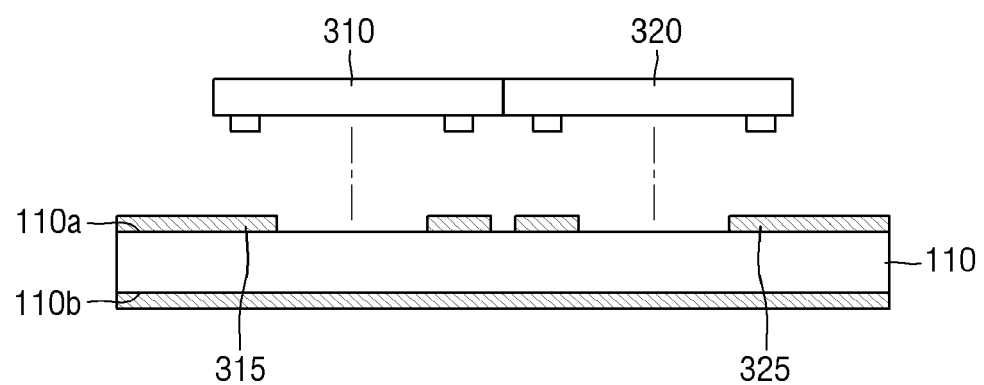

FIGS. 5 and 6 are cross-sectional views illustrating methods of attaching semiconductor chips on a semiconductor package according to some example embodiments of the present disclosure.

Referring to FIG. 5, first and second semiconductor chips 310 and 320, which are adjacent to each other, may be attached separately on a film substrate 110.

For example, the first semiconductor chip 310 may be attached on the film substrate 110 first, and then, the second semiconductor chip 320 may be attached on the film substrate 110. The first and second semiconductor chips 310 and 320 may be attached on the film substrate 110 by, for example, an attachment device 700.

In some example embodiments, the first semiconductor chip 310 may be attached on the film substrate 110, and then, the second semiconductor chip 320, which is thicker than the first semiconductor chip 310, may be attached on the film substrate 110. In this case, even if the width of the attachment device 700 is greater than the thickness of the second semiconductor chip 320, the second semiconductor chip 320 can be easily attached near the first semiconductor chip 310. For example, the first and second semiconductor chips 310 and 320 can be formed to be 100 μm or less apart from each other.

However, the present disclosure is not limited to this. That is, the thickness of the first semiconductor chip 310 and the thickness of the second semiconductor chip 320 may be the same depending on how and by what the first and second semiconductor chips 310 and 320 are attached on the film substrate 110.

Referring to FIG. 6, first and second semiconductor chips 310 and 320, which are adjacent to each other, may be attached at the same time on a film substrate 110.

In some example embodiments, a plurality of semiconductor chips, which are adjacent to one another, may be cut at once from a wafer, and may then be attached on the film substrate 110.

For example, the first and second semiconductor chips 310 and 320, which are adjacent to each other, may be cut at once from the wafer and may then be attached on the film substrate 110. Accordingly, the first and second semiconductor chips 310 and 320 can be easily attached on the film substrate 110 to be adjacent to each other. For example, the first and second semiconductor chips 310 and 320 may be formed on the film substrate 110 to be in contact with each other. For example, scribe lines of the wafer may remain between the first and second semiconductor chips 310 and 320.

Semiconductor packages according to some example embodiments of the present disclosure will hereinafter be described with reference to FIGS. 7 through 13.

Figure 9:
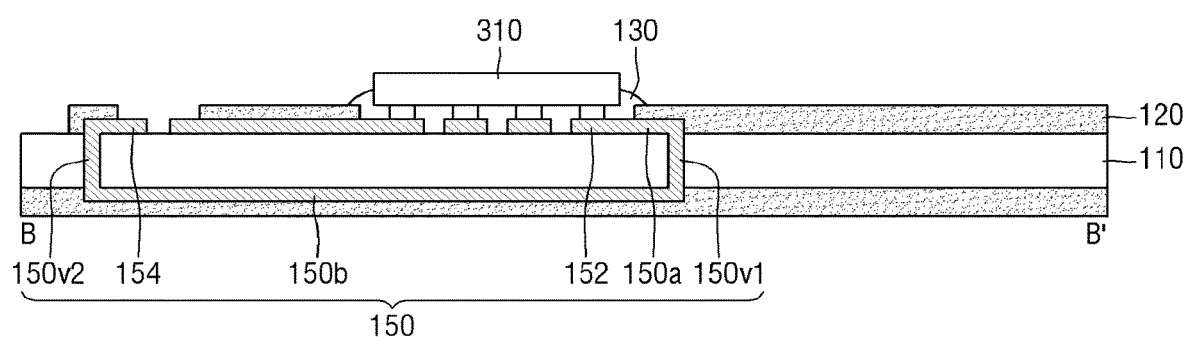
FIGS. 9 and 10 are cross-sectional views taken along line B-B' of FIGS. 7 and 8.
Figure 10:
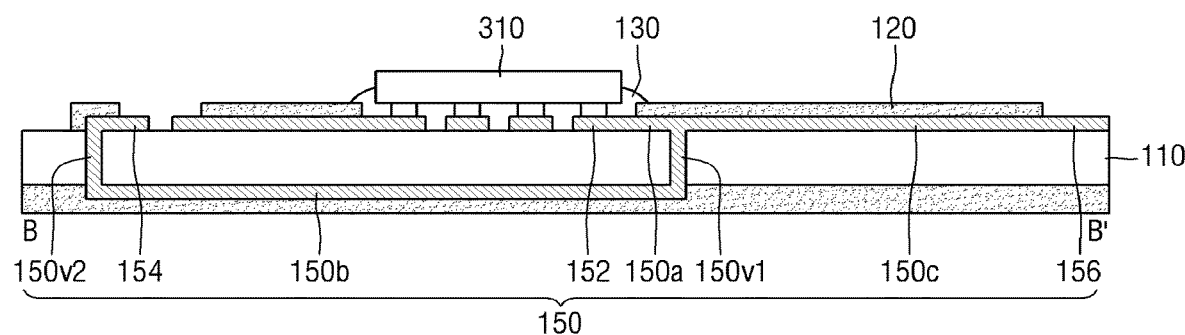
Figure 11:
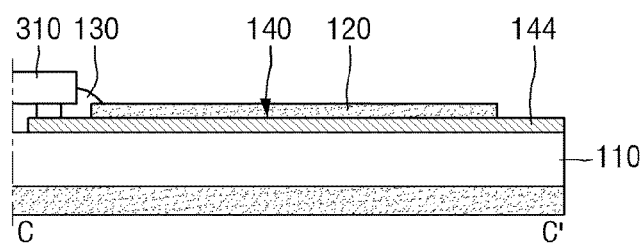
FIG. 11 is a cross-sectional view taken along line C-C' of FIGS. 7 and 8.
Figure 12:
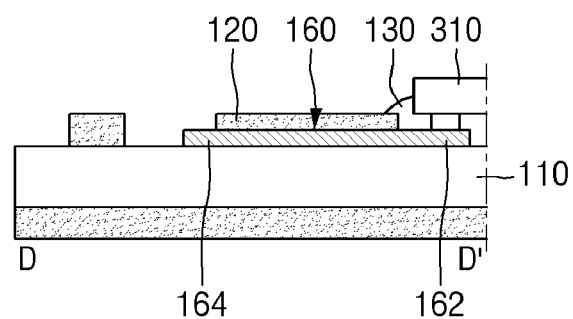
FIGS. 12 and 13 are cross-sectional views taken along line D-D' of FIGS. 7 and 8.
Figure 13:
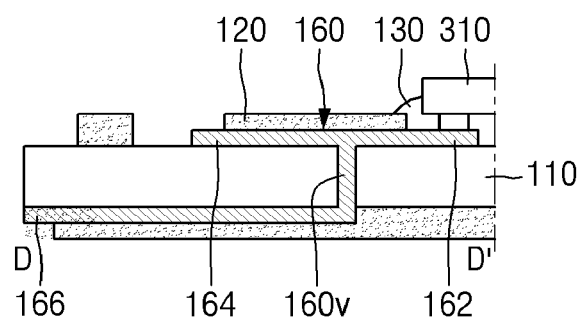

FIGS. 7 and 8 are layout views of a semiconductor package according to some example embodiments of the present disclosure. FIGS. 9 and 10 are cross-sectional views taken along line B-B' of FIGS. 7 and 8. FIG. 11 is a cross-sectional view taken along line C-C' of FIGS. 7 and 8. FIGS. 12 and 13 are cross-sectional views taken along line D-D' of FIGS. 7 and 8. For convenience, descriptions of elements or features that have already been described above with reference to FIGS. 1 through 6 may be omitted or at least simplified. Also, for convenience, first and second semiconductor chips 310 and 320 are not illustrated in FIGS. 7 and 8.

FIG. 7 is a layout view illustrating a first surface 110*a* of a film substrate 110, and FIG. 8 is a layout view illustrating a second surface 110*b* of the film substrate 110.

Referring to FIGS. 7 through 13, a first pad group PG1 includes a first pad 152, a second pad 142, and a third pad 162, and a second pad group PG2 includes a fourth pad 252, a fifth pad 242, and a sixth pad 262. The semiconductor package according to some example embodiments of the present disclosure includes a first wire 150, a second wire 140, a third wire 160, a fourth wire 250, a fifth wire 240, and a sixth wire 260.

The first, second, and third pads 152, 142, and 162 may be in a sequence (e.g., sequentially arranged) in a second direction X. The first pad 152 may be adjacent to the second semiconductor chip 320. For example, the first pad 152 may be closer than the second and third pads 142 and 162 to the second semiconductor chip 320.

The fourth, fifth, and sixth pads 252, 242, and 262 may be in a sequence (e.g., sequentially arranged) in the second direction X. The fourth pad 252 may be adjacent to the first semiconductor chip 310. For example, the fourth pad 252 may be closer than the fifth and sixth pads 242 and 262 to the first semiconductor chip 310. In some example embodiments, the fourth pad 252 may be adjacent to the first pad 152.

The first wire 150 may connect the first semiconductor chip 310 and a second bonding region BR2. For example, the first wire 150 may connect the first pad 152 and the third bonding pad 154. In some example embodiments, the first wire 150 may be an output wire. For example, the first wire 150 may electrically connect the first semiconductor chip 310 and the display panel 500 of FIG. 1.

In some example embodiments, at least part of the first wire 150 may extend along the second surface 110*b* of the film substrate 110. For example, as illustrated in FIG. 9, the first wire 150 may include a first extended portion 150*a*, a first via 150*v*1, a second extended portion 150*b*, and a second via 150*v*2.

The first extended portion 150*a* may connect the first pad 152 and the first via 150*v*1. The first extended portion 150*a* may extend along the first surface 110*a* of the film substrate 110.

The first via 150*v*1 may penetrate the film substrate 110. The first via 150*v*1 may connect the first extended portion 150*a* and the second extended portion 150*b*. In some example embodiments, as illustrated in FIGS. 7 and 8, the first via 150*v*1 may be disposed between a chip region CR and a first bonding region BR1.

The second extended portion 150*b* may connect the first via 150*v*1 and the second via 150*v*2. The second extended portion 150*b* may extend along the second surface 110*b* of the film substrate 110. In some example embodiments, as illustrated in FIG. 9, at least part of the second extended portion 150*b* may be overlapped by the first semiconductor chip 310. Similarly, at least part of a portion (e.g., an "extended portion") of the fourth wire 250 that extends along the second surface 110*b* of the film substrate 110 may be overlapped by the second semiconductor chip 320. Moreover, in some embodiments, a plurality of first wires 150 may be overlapped by the first semiconductor chip 310, and/or a plurality of fourth wires 250 may be overlapped by the second semiconductor chip 320. As used herein, the terms/expressions "overlap," "overlapped," and "two elements overlap" mean that the two elements overlap in a vertical direction.

The second via 150*v*2 may penetrate the film substrate 110. The second via 150*v*2 may connect the second extended portion 150*b* and the third bonding pad 154. In some example embodiments, as illustrated in FIGS. 7 and 8, the second via 150*v*2 may be disposed in the second bonding region BR2.

In some example embodiments, the second via 150*v*2 may not be provided (i.e., may be omitted). For example, in a case where the third bonding pad 154 is formed on the second surface 110*b* of the second bonding region BR2, the second via 150v2 may not be provided. For example, the second extended portion 150b may be directly connected to the third bonding pad 154.

In some example embodiments, the first wire 150 may further include a test wire, which is for testing the characteristics of the first semiconductor chip 310. In a case where the first wire 150 comprises an output wire, the output characteristic of the first semiconductor chip 310 may be tested. For example, as illustrated in FIG. 10, the first wire 150 may further include a third extended portion 150c and a first test pad 156.

In some example embodiments, the third extended portion 150c may extend from the first pad 152 in a direction toward the first bonding region BR1. Also, the third extended portion 150c may extend along the first surface 110a of the film substrate 110. In some example embodiments, the first test pad 156 may be disposed in the first bonding region BR1. On the other hand, in some example embodiments, the first test pad 156 may be removed/omitted from the film substrate 110.

The second wire 140 may connect the first semiconductor chip 310 and the first bonding region BR1. For example, the second wire 140 may connect the second pad 142 and the first bonding pad 144. In some example embodiments, the second wire 140 may be an input wire. For example, the second wire 140 may electrically connect the first semiconductor chip 310 and the driver printed circuit 400 of FIG. 1.

In some example embodiments, as illustrated in FIG. 11, the second wire 140 may extend along the first surface 110a of the film substrate 110. The first bonding pad 144 may be exposed by a resist film 120.

The third wire 160 may connect the first semiconductor chip 310 and the second bonding region BR2. For example, the third wire 160 may connect the third pad 162 and the fourth bonding pad 164. In some example embodiments, the third wire 160 may be an output wire. For example, the third wire 160 may electrically connect the first semiconductor chip 310 and the display panel 500 of FIG. 1.

In some example embodiments, as illustrated in FIG. 12, the third wire 160 may extend along the first surface 110a of the film substrate 110. The fourth bonding pad 164 may be exposed by the resist film 120.

In some example embodiments, as illustrated in FIG. 7, the third wire 160 may extend between the first semiconductor chip 310 and one of the direct wires 330.

In some example embodiments, the third wire 160 may further include a test wire, which is for testing the characteristics of the first semiconductor chip 310. In a case where the third wire 160 is an output wire, the output characteristic of the first semiconductor chip 310 may be tested. For example, as illustrated in FIG. 13, the third wire 160 may further include a third via 160v and a second test pad 166.

In some example embodiments, part of the third wire 160 may extend along the second surface 110b of the film substrate 110. In some example embodiments, part of the third wire 160 may extend from the third pad 162 in a direction toward the second bonding region BR2 via the third via 160v. In some example embodiments, the second test pad 166 may be disposed in the second bonding region BR2. On the other hand, in some example embodiments, the second test pad 166 may be removed/omitted from the film substrate 110.

The fourth wire 250 may connect the second semiconductor chip 320 and the second bonding region BR2. For example, the fourth wire 250 may connect the fourth pad 252 and the fifth bonding pad 254. In some example embodiments, the fourth wire 250 may be an output wire.

For example, the fourth wire 250 may electrically connect the second semiconductor chip 320 and the display panel 500 of FIG. 1.

In some example embodiments, at least part of the fourth wire 250 may extend along the second surface 110b of the film substrate 110. For example, the fourth wire 250 may include fourth and fifth vias 250v1 and 250v2, which penetrate the film substrate 110. In some example embodiments, the fourth via 250v1 may be disposed between the chip region CR and the first bonding region BR1, and the fifth via 250v2 may be disposed in the second bonding region BR2.

In some example embodiments, the fifth via 250v2 may not be provided (i.e., may be omitted). For example, in a case where the fifth bonding pad 254 is formed on the second surface 110b of the second bonding region BR2, the fifth via 250v2 may not be provided.

The fifth wire 240 may connect the second semiconductor chip 320 and the first bonding region BR1. For example, the fifth wire 240 may connect the fifth pad 242 and the second bonding pad 244. In some example embodiments, the fifth wire 240 may be an input wire. For example, the fifth wire 240 may electrically connect the second semiconductor chip 320 and the driver printed circuit 400 of FIG. 1.

In some example embodiments, the fifth wire 240 may extend along the first surface 110a of the film substrate 110.

The sixth wire 260 may connect the second semiconductor chip 320 and the second bonding region BR2. For example, the sixth wire 260 may connect the sixth pad 262 and the sixth bonding pad 264. In some example embodiments, the sixth wire 260 may be an output wire. For example, the sixth wire 260 may electrically connect the second semiconductor chip 320 and the display panel 500 of FIG. 1.

In some example embodiments, the sixth wire 260 may extend along the first surface 110a of the film substrate 110. In some example embodiments, the sixth wire 260 may extend between the second semiconductor chip 320 and one of the direct wires 330.

As electronic products have become compact in size, thin, and lightweight, the demand for compact semiconductor packages for use in such electronic products has increased. According to the example embodiments of FIGS. 7 through 13, a compact semiconductor package can be provided by reducing/minimizing the distance between semiconductor chips.

For example, the distance between the first and second semiconductor chips 310 and 320 can be reduced/minimized by forming the first wire 150, which is adjacent to the second semiconductor chip 320, to extend along the second surface 110b of the film substrate 110. For example, the first and second semiconductor chips 310 and 320 may be formed to be only about 100 μm or less apart from each other. Accordingly, a semiconductor package that is compact in size, for example, in the second direction X, can be provided. If the first wire 150, which is adjacent to the second semiconductor chip 320, extends along only the first surface 110a of the film substrate 110, the first wire 150 may extend between the first and second semiconductor chips 310 and 320. In this case, the distance between the first and second semiconductor chips 310 and 320 increases, which, however, adversely affects the downsizing of a semiconductor package.

Figure 14:
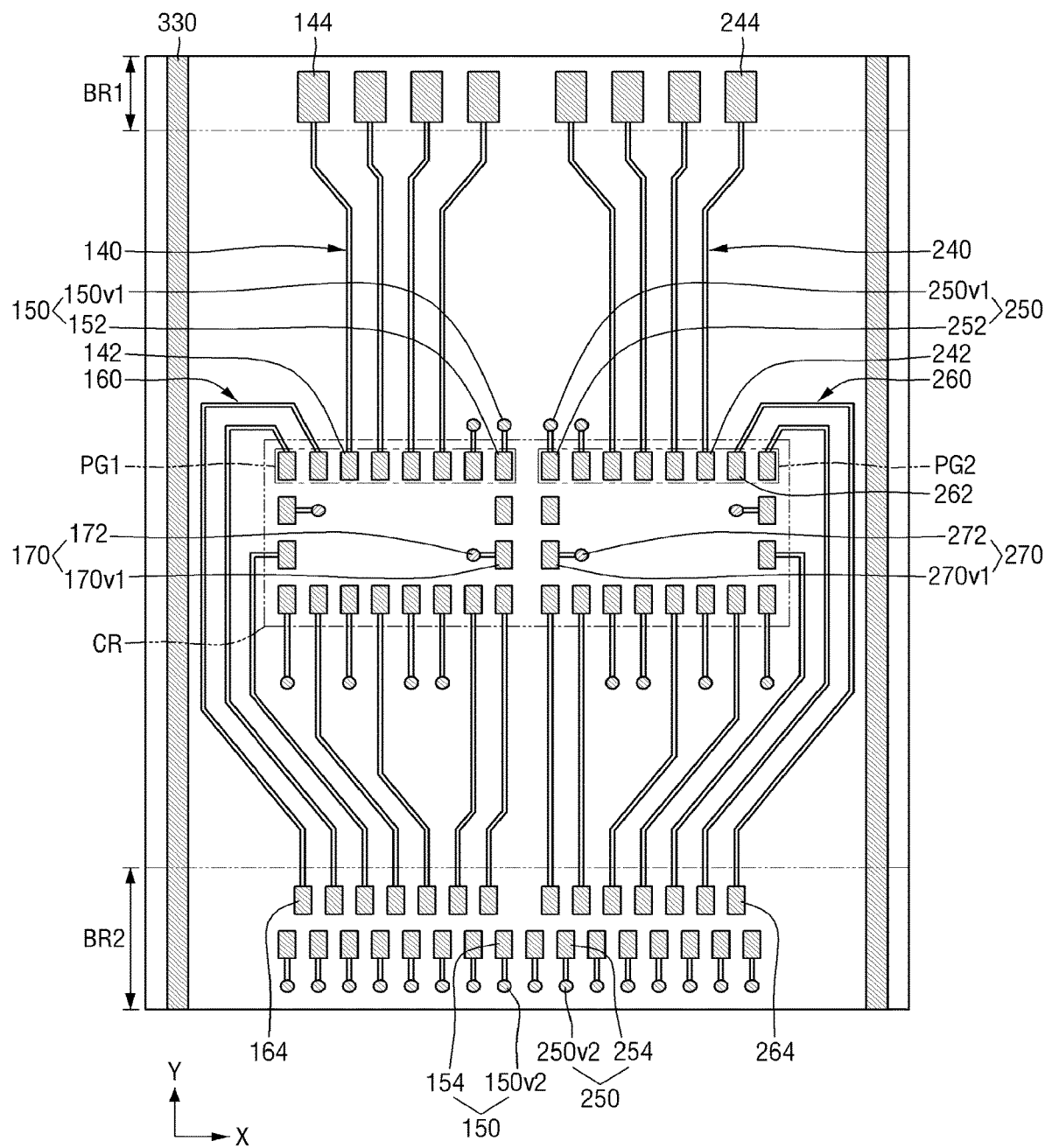
FIGS. 14 and 15 are layout views of a semiconductor package according to some example embodiments of the present disclosure.
Figure 15:
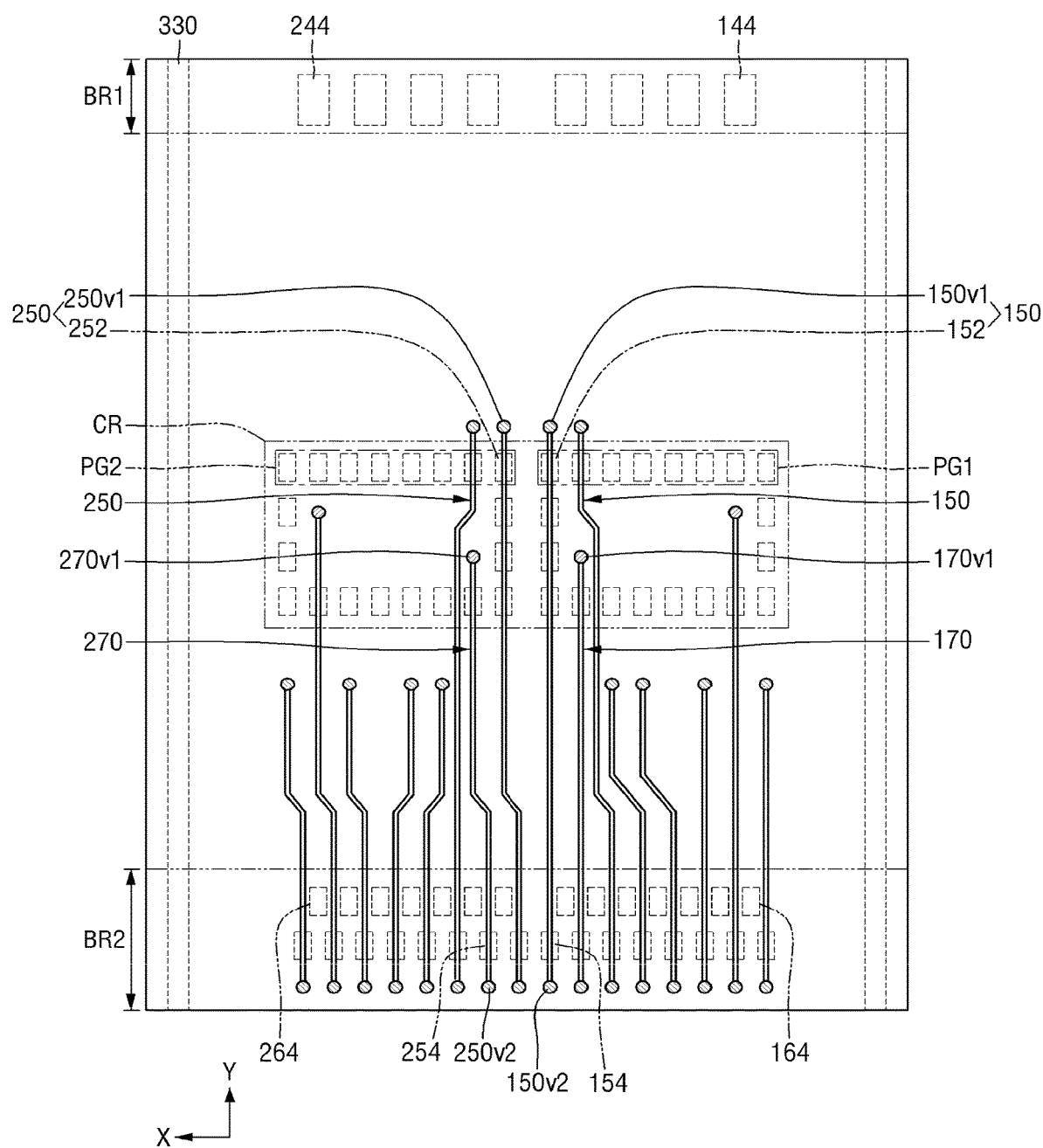

FIGS. 14 and 15 are layout views of a semiconductor package according to some example embodiments of the present disclosure. For convenience, descriptions of elements or features that have already been described above with reference to FIGS. 1 through 13 may be omitted or at least simplified. Also, for convenience, some wires extending along a film substrate 110 are not illustrated in FIGS. 14 and 15.

FIG. 14 is a layout view illustrating a first surface 110a of a film substrate 110, and FIG. 15 is a layout view illustrating a second surface 110b of the film substrate 110.

Referring to FIGS. 14 and 15, the semiconductor package according to some example embodiments of the present disclosure includes seventh and eighth wires 170 and 270.

The seventh wire 170 may connect a first semiconductor chip 310 and a second bonding region BR2. In some example embodiments, the seventh wire 170 may be an output wire. For example, the seventh wire 170 may electrically connect the first semiconductor chip 310 and the display panel 500 of FIG. 1.

At least part of the seventh wire 170 may extend along the second surface 110b of the film substrate 110. For example, the seventh wire 170 may include a sixth via 170v1, which penetrates the film substrate 110. In some example embodiments, the sixth via 170v1 may be disposed in a chip region CR. For example, the sixth via 170v1 may be overlapped by the first semiconductor chip 310.

The seventh wire 170 may connect a seventh pad 172 and a third bonding pad 154. In some example embodiments, the seventh pad 172 may be closer to a first pad group PG1 than to the second bonding region BR2.

The eighth wire 270 may connect a second semiconductor chip 320 and the second bonding region BR2. In some example embodiments, the eighth wire 270 may be an output wire. For example, the eighth wire 270 may electrically connect the second semiconductor chip 320 and the display panel 500 of FIG. 1.

At least part of the eighth wire 270 may extend along the second surface 110b of the film substrate 110. For example, the eighth wire 270 may include a seventh via 270v1, which penetrates the film substrate 110. In some example embodiments, the seventh via 270v1 may be disposed in the chip region CR. For example, the seventh via 270v1 may be overlapped by the second semiconductor chip 320.

The eighth wire 270 may connect an eighth pad 272 and a fifth bonding pad 254. In some example embodiments, the eighth pad 272 may be closer to a second pad group PG2 than to the second bonding region BR2.

Figure 16:
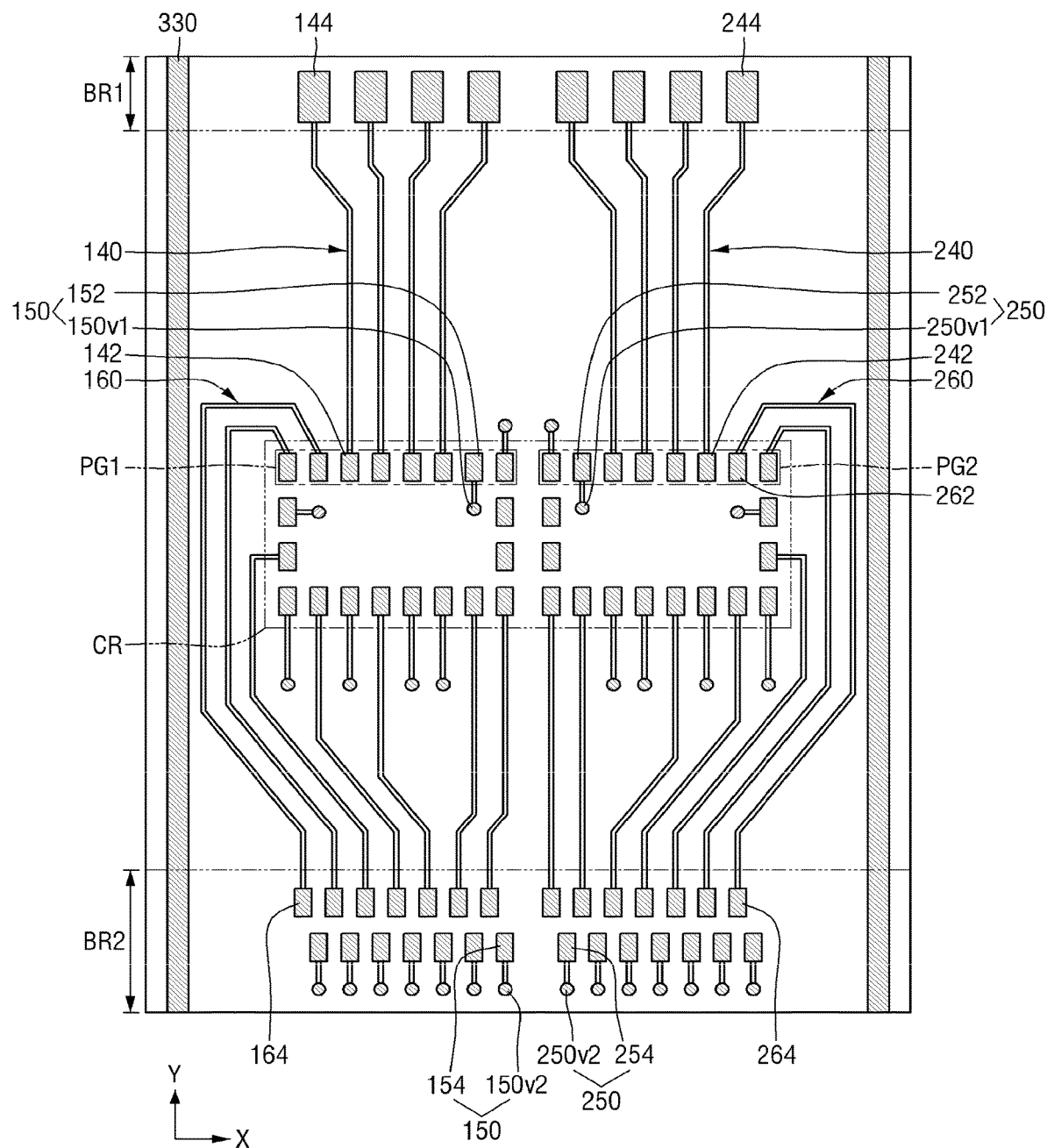
FIGS. 16 and 17 are layout views of a semiconductor package according to some example embodiments of the present disclosure.
Figure 17:
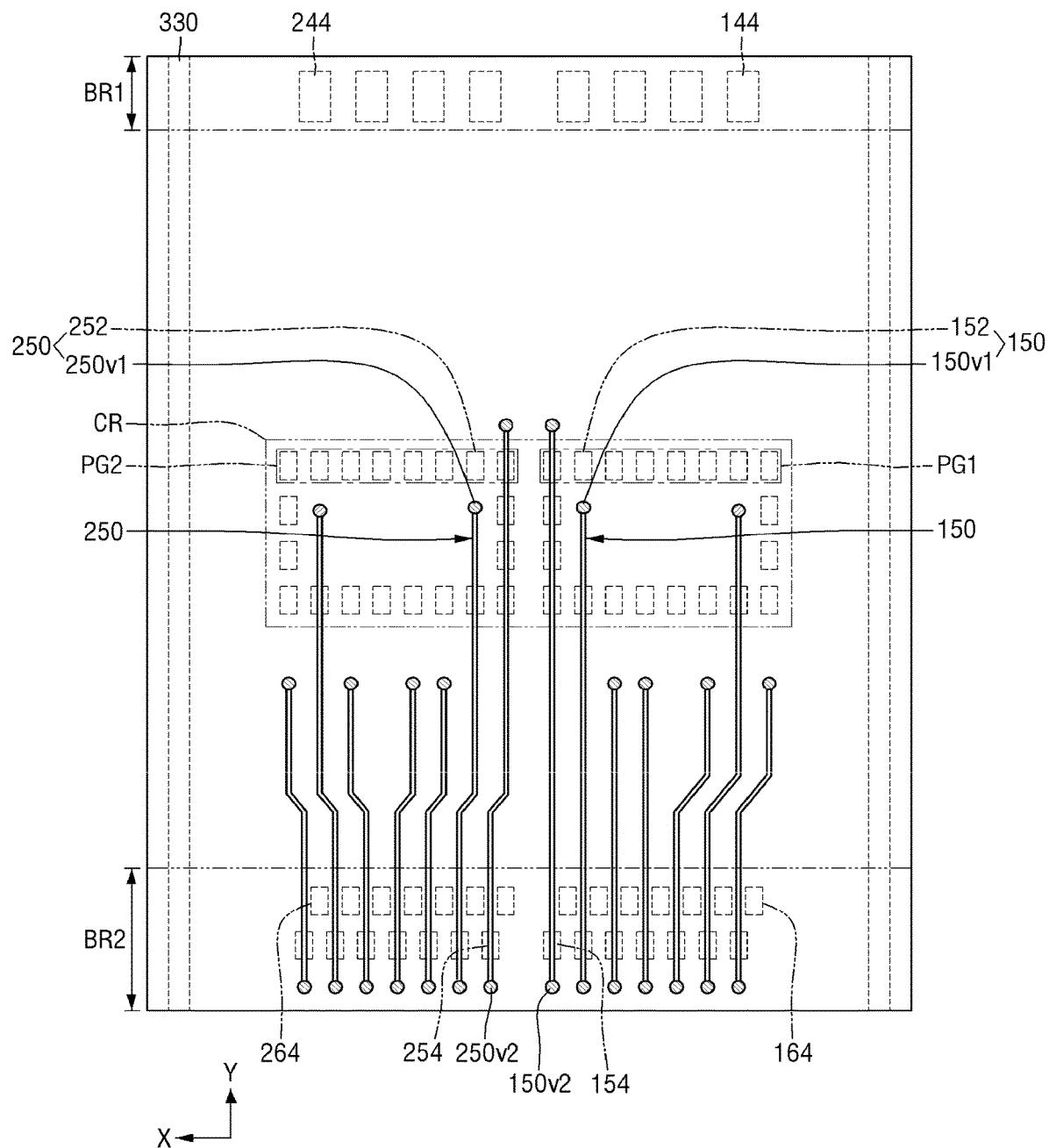

FIGS. 16 and 17 are layout views of a semiconductor package according to some example embodiments of the present disclosure. For convenience, descriptions of elements or features that have already been described above with reference to FIGS. 1 through 13 may be omitted or at least simplified. Also, for convenience, first and second semiconductor chips 310 and 320 are not illustrated in FIGS. 16 and 17.

FIG. 16 is a layout view illustrating a first surface 110a of a film substrate 110, and FIG. 17 is a layout view illustrating a second surface 110b of the film substrate 110.

Referring to FIGS. 16 and 17, a first via 150v1 of a first wire 150 may be disposed in a chip region CR. For example, the first via 150v1 may be overlapped by the first semiconductor chip 310.

In some example embodiments, a fourth via 250v1 of a fourth wire 250, like the first via 150v1, may be disposed in the chip region CR. For example, the fourth via 250v1 may be overlapped by the second semiconductor chip 320.

Figure 18:
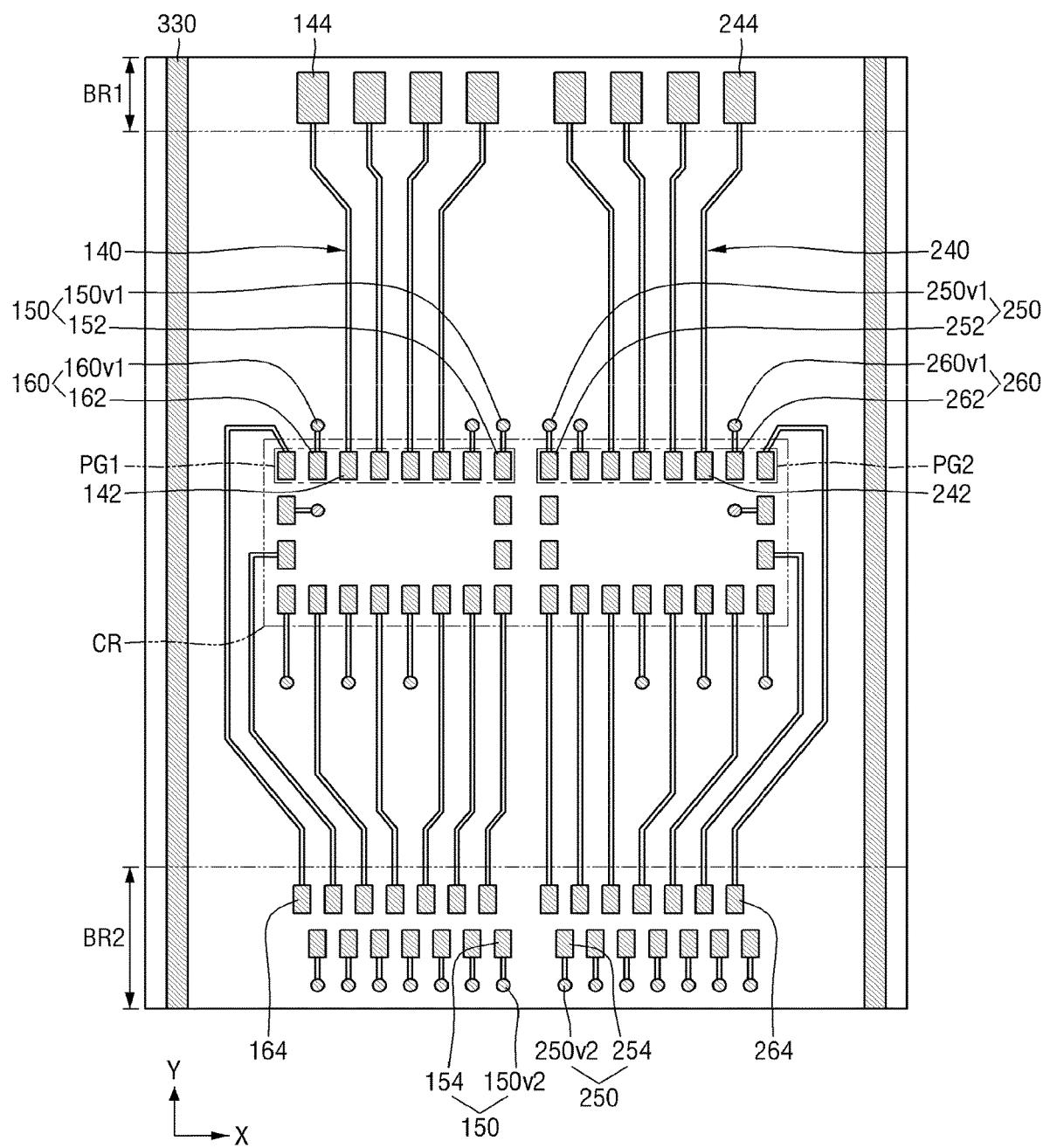
FIGS. 18 and 19 are layout views of a semiconductor package according to some example embodiments of the present disclosure.
Figure 19:
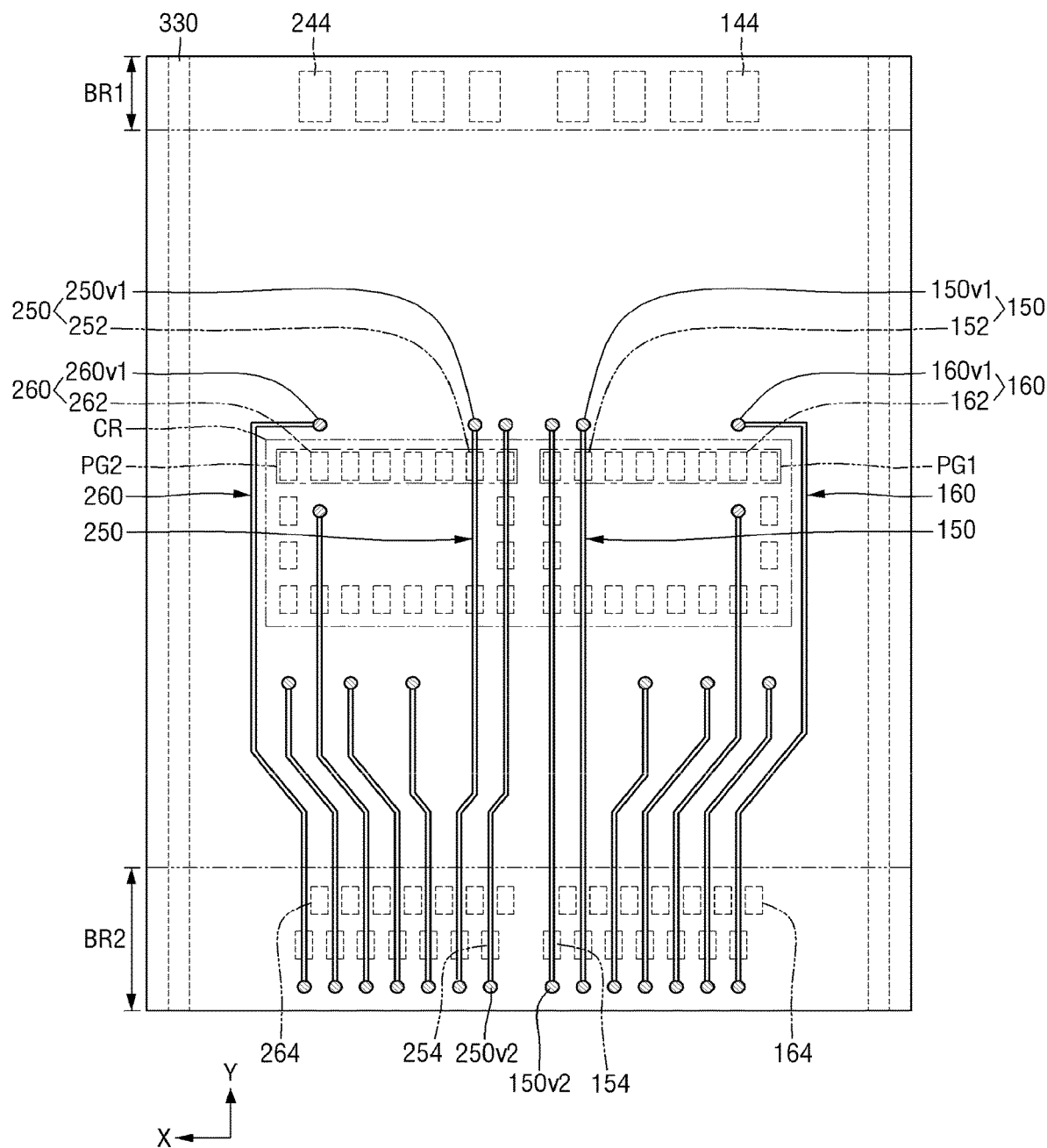

FIGS. 18 and 19 are layout views of a semiconductor package according to some example embodiments of the present disclosure. For convenience, descriptions of elements or features that have already been described above with reference to FIGS. 1 through 13 may be omitted or at least simplified. Also, for convenience, first and second semiconductor chips 310 and 320 are not illustrated in FIGS. 18 and 19.

FIG. 18 is a layout view illustrating a first surface 110a of a film substrate 110, and FIG. 19 is a layout view illustrating a second surface 110b of the film substrate 110.

Referring to FIGS. 18 and 19, at least part of a third wire 160 may extend along the second surface 110b of the film substrate 110. For example, the third wire 160 may include an eighth via 160v1, which penetrates the film substrate 110. In some example embodiments, the eighth via 160v1 may be disposed between a chip region CR and a first bonding region BR1.

In some example embodiments, at least part of a sixth wire 260, like at least part of the third wire 160, may extend along the second surface 110b of the film substrate 110. For example, the sixth wire 260 may include a ninth via 260v1, which penetrates the film substrate 110. In some example embodiments, the ninth via 260v1 may be disposed between the chip region CR and the first bonding region BR1.

As illustrated in FIG. 19, the third and sixth wires 160 and 260 may not overlap with the chip region CR, but the present disclosure is not limited thereto. That is, alternatively, at least part of the third wire 160 and/or at least part of the sixth wire 260 may overlap with the chip region CR.

Figure 20:
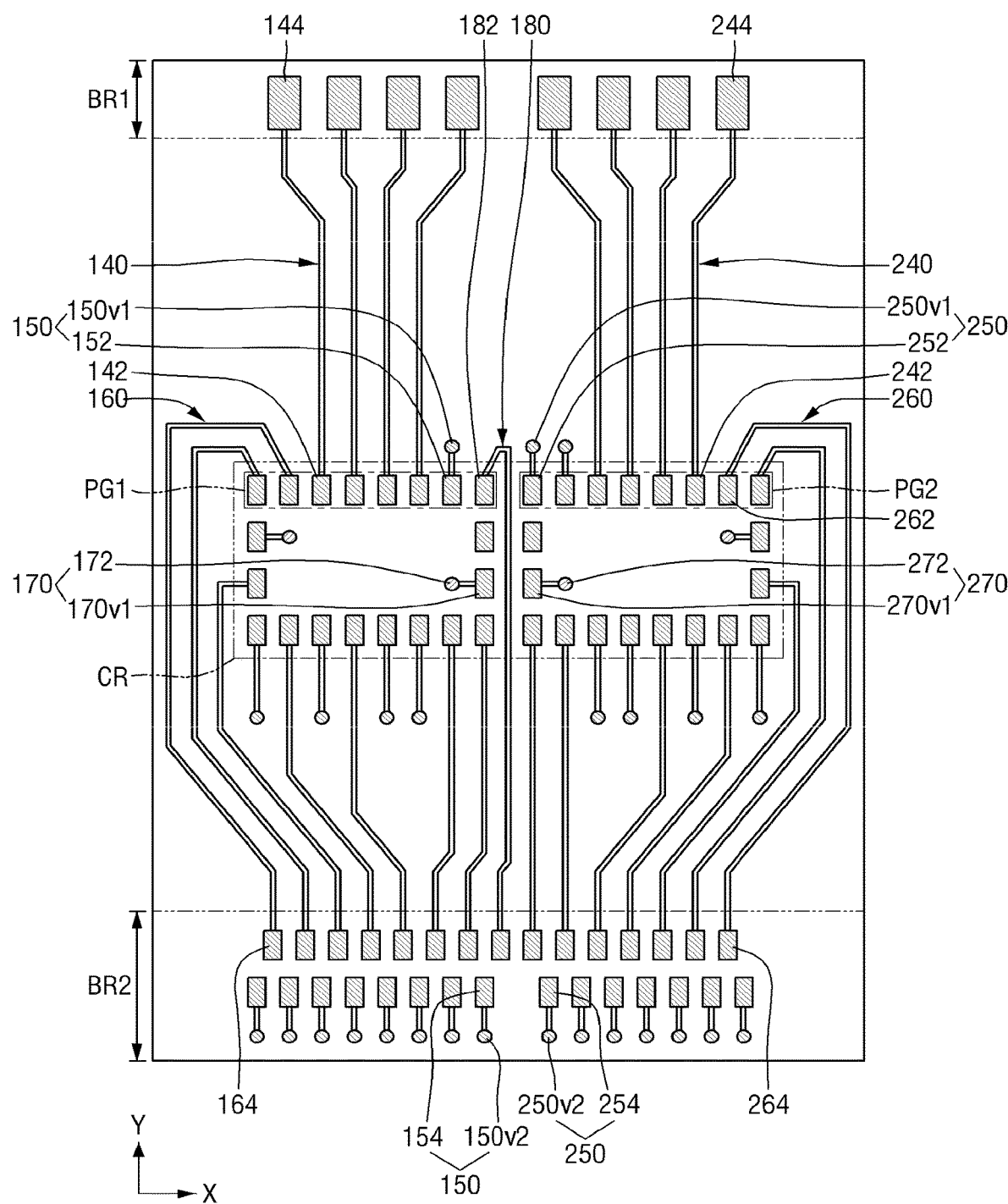
FIGS. 20 and 21 are layout views of a semiconductor package according to some example embodiments of the present disclosure.
Figure 21:
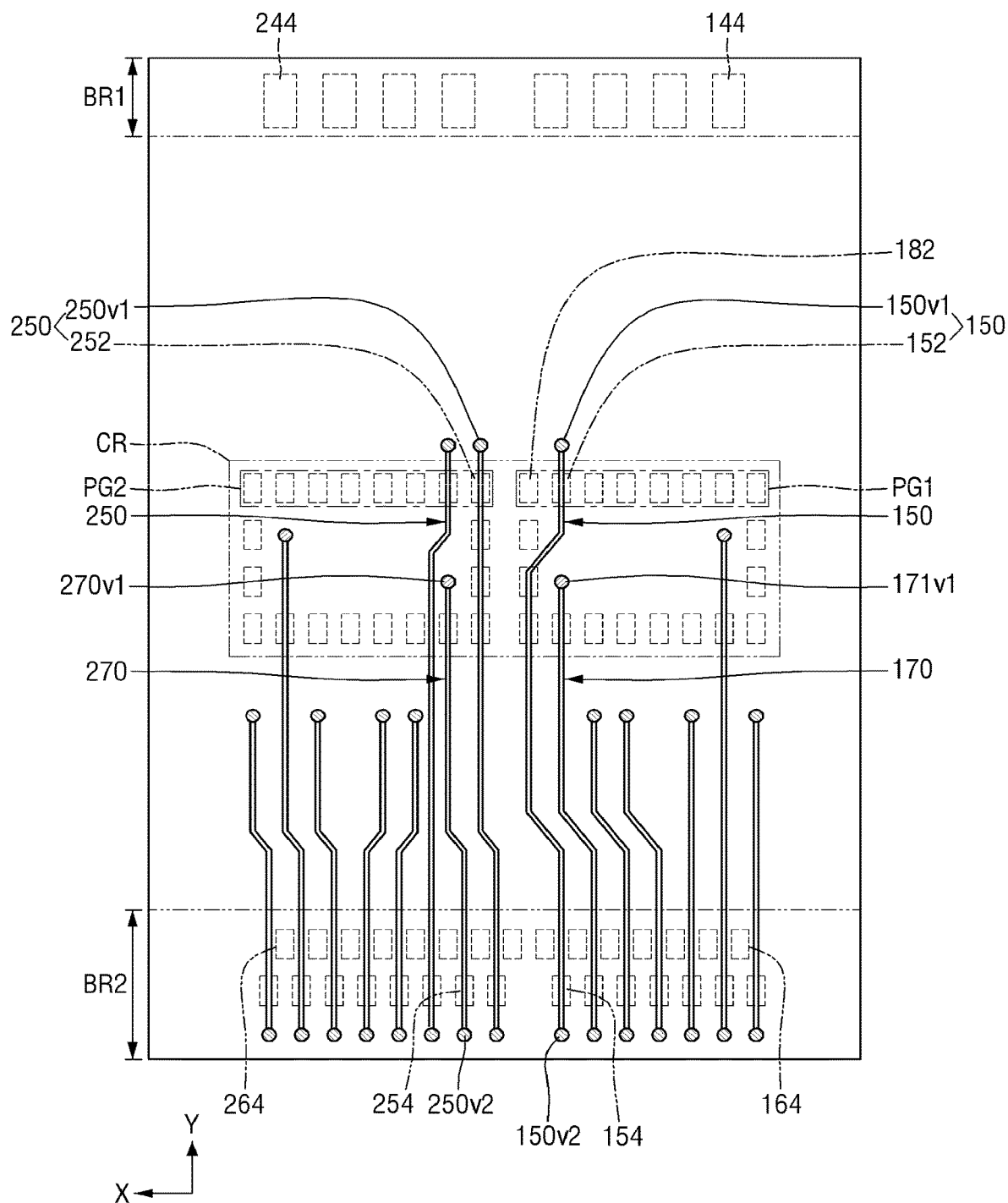

FIGS. 20 and 21 are layout views of a semiconductor package according to some example embodiments of the present disclosure. For convenience, descriptions of elements or features that have already been described above with reference to FIGS. 1 through 15 may be omitted or at least simplified. Also, for convenience, first and second semiconductor chips 310 and 320 are not illustrated in FIGS. 20 and 21.

FIG. 20 is a layout view illustrating a first surface 110a of a film substrate 110, and FIG. 21 is a layout view illustrating a second surface 110b of the film substrate 110.

Referring to FIGS. 20 and 21, a first pad group PG1 may further include a ninth pad 182. The semiconductor package according to some example embodiments of the present disclosure may further include a ninth wire 180.

In some example embodiments, the ninth pad 182 may be closer than a first pad 152 to the second semiconductor chip 320. For example, the ninth pad 182 may be closer than the first pad 152 to a fourth pad 252.

The ninth wire 180 may connect the first semiconductor chip 310 and a first bonding region BR1. In some example embodiments, the ninth wire 180 may be an output wire. For example, the ninth wire 180 may electrically connect the first semiconductor chip 310 and the display panel 500 of FIG. 1.

The ninth wire 180 may extend between the first and second semiconductor chips 310 and 320. For example, the ninth wire 180 may extend between the first and fourth pads 152 and 252.

In some example embodiments, the ninth wire 180 may extend along the first surface 110a of the film substrate. For example, the ninth wire 180 may connect the ninth pad 182 and the fourth bonding pad 164.

The semiconductor package according to some example embodiments of the present disclosure may not include (i.e., may omit, be free of) direct wires. For example, as illustrated in FIGS. 20 and 21, no direct wires (330 of FIGS. 7 and 8) may be provided to connect the first bonding region BR1 and a second bonding region BR2.

Although the present inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that the example embodiments be considered in all respects as illustrative and not restrictive, reference being made to the appended claims rather than the foregoing description to indicate the scope of the inventive concepts.

What is claimed is:

1. A display device comprising:
    a film substrate comprising a first bonding region, a chip region, and a second bonding region that are in a sequence in a first direction, and further comprising first and second surfaces that are opposite to each other;
    a pad group comprising input and output pads that are on the first surface in the chip region and are spaced apart from each other in a second direction that intersects the first direction;
    a first display driver integrated circuit (DDI) on the pad group on the first surface;
    a second DDI on the first surface in the chip region, adjacent the first DDI in the second direction, and closer to the output pad than to the input pad;
    an input wire connecting the input pad and the first bonding region and extending along the first surface of the film substrate; and
    an output wire connecting the output pad and the second bonding region and extending at least partially along the second surface of the film substrate,
    wherein a distance in the second direction between the first and second DDIs is 100 micrometers (μm) or shorter.

2. The display device of claim 1, wherein the output wire comprises a via that penetrates the film substrate, a first extended portion that connects the output pad and the via, and a second extended portion that connects the via and the second bonding region and extends along the second surface of the film substrate.

3. The display device of claim 2, wherein the via is between the chip region and the first bonding region.

4. The display device of claim 2, wherein at least part of the second extended portion is overlapped by the first DDI.

5. The display device of claim 2, wherein the output wire further comprises a test pad that is in the first bonding region, and a third extended portion that connects the output pad and the test pad and extends along the first surface of the film substrate.

6. The display device of claim 1, further comprising:
    a bonding pad on the first surface in the second bonding region,
    wherein the output wire connects the output pad and the bonding pad.

7. The display device of claim 1, further comprising:
    a driver printed circuit connected to the first bonding region; and
    a display panel connected to the second bonding region.

8. The display device of claim 1, wherein a first thickness of the first DDI is different from a second thickness of the second DDI.

9. The display device of claim 1, wherein the first and second DDIs contact each other.

10. A display device comprising:
    a film substrate comprising a first bonding region, a chip region, and a second bonding region that are in a sequence in a first direction, and further comprising first and second surfaces that are opposite to each other;
    a pad group comprising first and second pads that are on the first surface in the chip region and are spaced apart from each other in a second direction that intersects the first direction;
    a first display driver integrated circuit (DDI) on the pad group on the first surface;
    a second DDI on the first surface in the chip region, adjacent the first DDI in the second direction, and closer to the first pad than to the second pad;
    a first wire connecting the first pad and the second bonding region and extending at least partially along the second surface of the film substrate;
    a second wire connecting the second pad and the first bonding region and extending along the first surface of the film substrate;
    a driver printed circuit connected to the first bonding region; and
    a display panel connected to the second bonding region,
    wherein a distance in the second direction between the first and second DDIs is 100 micrometers (μm) or shorter.

11. The display device of claim 10, wherein the first wire comprises a first via that penetrates the film substrate, a first extended portion that connects the first pad and the first via, and a second extended portion that connects the first via and the second bonding region and extends along the second surface of the film substrate.

12. The display device of claim 11, further comprising:
    a bonding pad on the first surface in the second bonding region,
    wherein the first wire further comprises a second via that is in the second bonding region and penetrates the film substrate, and
    wherein the second via connects the second extended portion and the bonding pad.

13. The display device of claim 10, further comprising:
    a third wire extending along the first surface of the film substrate,
    wherein the pad group further comprises a third pad that is on the first surface in the chip region and are spaced apart from the first and second pads in the second direction, and
    wherein the third wire connects the third pad and the second bonding region.

14. The display device of claim 13, wherein the second pad is between the first and third pads.

15. The display device of claim 10, further comprising:
    a third wire between the first and second DDIs,
    wherein the pad group further comprises a third pad that is closer than the first pad to the second DDI, and
    wherein the third wire connects the third pad and the second bonding region.

16. The display device of claim 10, further comprising:
    a direct wire extending on the first surface of the film substrate to connect the first and second bonding regions.

* * * * *